(12) United States Patent
Chen et al.

(10) Patent No.: US 7,948,406 B2
(45) Date of Patent: May 24, 2011

(54) METHOD FOR ENCODING AND DECODING A SEQUENCE OF INTEGERS

(75) Inventors: Qu Qing Chen, Beijing (CN); Zhi Bo Chen, Beijing (CN); Jun Teng, Beijing (CN)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 12/386,579

(22) Filed: Apr. 21, 2009

(65) Prior Publication Data
US 2009/0267812 A1    Oct. 29, 2009

(30) Foreign Application Priority Data

Apr. 25, 2008   (EP) .................................... 08305130

(51) Int. Cl.
*H03M 7/40* (2006.01)
(52) U.S. Cl. .......................................... 341/67; 341/65
(58) Field of Classification Search ................ 341/65, 341/67
See application file for complete search history.

(56) References Cited

U.S. PATENT DOCUMENTS 7,209,059 B2 *  4/2007  Lim et al. .......................... 341/67
7,362,245 B2 *  4/2008  Kuo et al. ......................... 341/67

OTHER PUBLICATIONS

Search Report, Aug. 26, 2008.
Golomb S.W.: "Run-Length Encodings" ieee transactions on information theory, us, vol. 12, No. 3, Jul. 1, 1966, pp. 399-401 XP000867152 issn: 0018-9448.
David Solomon: "Data Compression, The Complete Reference" 2007, springer, XP002493441 p. 63-p. 70.
Elias, "Universal Codeword Sets and Representations of the Integers", IEEE Transactions on Information Theory, vol. IT-21, No. 2, Mar. 1975, 3 pages.

* cited by examiner

*Primary Examiner* — Khai M Nguyen
(74) *Attorney, Agent, or Firm* — Robert D. Shedd; Joseph J. Opalach; Jerome G. Schaefer

(57) ABSTRACT

A method for encoding a sequence of integers includes identifying a contiguous sub-sequence in the sequence of integers wherein the sub-sequence includes interrelated integers having a same prefix when being variable length encoded and an independent last integer. A code for the contiguous sub-sequence is formed using a code for an indication of the number of interrelated integers in the contiguous subsequence, a code of a prefix indication, and the suffixes of variable length codes of the integers in the contiguous sub-sequence. In doing so, a single prefix is sufficient instead of n individual prefixes.

15 Claims, 4 Drawing Sheets

| 4 3 | 5 6 4 5 6 7 8 | 4 5 1 | 7 4 2 |
|---|---|---|---|
| 00 1 | 01 10 00 01 10 11 000 | 00 01 [] | 11 00 0 |
| 2 1 | 2 2 2 2 2 2 3 | 2 2 0 | 2 2 1 |
| (0,2)(0,1) | (5,2)(0,3) | (1,2)(0,0) | (1,2)(0,1) |
| (1,1) | (6,3) | (2,0) | (2,1) |

<u>1 011</u> 00 <u>1 010</u> 1 <u>00110 011</u> 01 10 00 01 10 11 <u>1 00100</u>
000 <u>010 011</u> 00 01 <u>1 1</u> <u>010 011</u> 11 00 <u>1 010</u> 0

<u>011</u> <u>010 010</u> 00 1 <u>00111</u> <u>00100</u> 01 10 00 01
10 11 000 <u>011 1</u> 00 01 <u>011 010</u> 11 00 0

| 4 | 3 | 5 | 6 | 4 | 5 | 6 | 7 | 8 | 4 | 5 | 1 | 7 | 4 | 2 |
|---|---|---|---|---|---|---|---|---|---|---|---|---|---|---|
| 00 | 1 | 01 | 10 | 00 | 01 | 10 | 11 | 000 | 00 | 01 | 00 01 [] | 11 | 00 | 0 |
| 2 | 1 | 2 | 2 | 2 | 2 | 2 | 2 | 3 | 2 | 2 | 2 0 | 2 | 2 | 1 |
| (0,2)(0,1) | | | | (5,2)(0,3) | | | | | (1,2)(0,0) | | | (1,2)(0,1) | | |
| (1,1) | | | | (6,3) | | | | | (2,0) | | | (2,1) | | |

| 4 3 | 5 6 4 | 5 6 7 8 | 4 | 5 | 1 | 7 4 2 |
|---|---|---|---|---|---|---|
| 11 10 | 00 01 11 | 00 01 10 110 | 11 | 00 | [] | 10 110 |
| 2 2 | 3 3 2 | 3 3 3 2 | 2 | 3 | 1 | 3 2 2 |
| (1,1) | (1,2)(0,1) | (3,2)(0,1) | | (0,2)(0,0) | (0,2)(0,0) | (0,2)(1,1) |
| (0,1)(0,1) | (2,1) | (4,1) | | (1,0) | (1,1) | (0,1) |

METHOD FOR ENCODING AND DECODING A SEQUENCE OF INTEGERS

This application claims the benefit, under 35 U.S.C. §119, of European Patent Application No. 08305130.0 filed 25 Apr. 2008.

FIELD OF THE INVENTION

The present invention relates to a method for encoding a sequence of integers and further relates to a method for decoding an encoded integer sequence.

BACKGROUND OF THE INVENTION

In variable length coding (VLC), integers are encoded by a prefix and a suffix. For instance, the suffix comprises a varying number of bits carrying binary encoded pay load data. Then, the prefix comprises unary code representing the number of bits which are comprised in the corresponding suffix. A unary code represents a number by a corresponding number of equally valued bits. Thus, half of the bits used for encoding an integer are used for the prefix.

In sequences of integers comprising many contiguous sub-sequences of integers of a default value, each contiguous sub-sequence being followed by a single occurrence of an integer of another value, each of said sub-sequences may be presented by a variable length code of said other values preceded by a variable length code representation of the run, i.e. of the number of times said default value occurs in the contiguous subsequence preceding the coded other value. Optionally, the code may be preceded by a variable length code representation of said default value. This is called run-level coding.

If the integers in the contiguous sub-sequences do not all have a common default value but only a same or constant value within each of the sub-sequences, each of the sub-sequences may be represented by a variable length code of the corresponding constant value preceded by a variable length code representation of the run of said corresponding constant value. This is called run-length coding.

There is an ongoing effort to improve the encoding efficiency related to arbitrary integer sequences.

SUMMARY OF THE INVENTION

An efficient integer sequence encoding is achieved by a method for encoding a sequence of integers, the method comprising the features of claim 1.

Said method comprises the steps of identifying a contiguous sub-sequence in the sequence of integers wherein said sub-sequence comprises interrelated integers having a same prefix when being variable length encoded and an independent last integer, and forming a code for the contiguous subsequence by help of code for an indication of the number of interrelated integers in said contiguous subsequence, a code of a prefix indication and the suffixes of variable length codes of the integers in the contiguous sub-sequence.

Thus, if there are n integers in a contiguous subsequence of which each is encoded with the same prefix then, instead of n individual prefixes for the integers, a single prefix for the contiguous subsequence is sufficient. Thus, the subsequence can be coded with fewer bits.

In an embodiment, said prefix indication indicates said same prefix which is the prefix of a variable length code of the independent last integer, also.

In another embodiment, said same prefix is a default prefix and said prefix indication indicates another prefix which is the prefix of a variable length code of the independent last integer.

In yet another embodiment, the method further comprises enclosing a binary representation of said default prefix in said modified binary sequence.

In even yet another embodiment, said sequence of integers being related to a sequence of coded pay load values, said integers indicating the length of data fields carrying said coded pay load values.

The invention is further related to a method for encoding integer valued syntax elements of different types associated with macro blocks comprised in a slice of a frame, said method comprises sorting the syntax elements according their type, forming a sequence out of syntax elements of a single type and encoding the sequence of syntax elements of a single type according to one of the claims 1-4.

In another embodiment of said method for encoding integer valued syntax elements, said method comprises sorting the syntax elements according their type, forming a sequence out of syntax elements of a single type and encoding the sequence of syntax elements of a single type as said sequence of encoded pay load values according to claim 5.

The invention is further related to a storage medium carrying a pair of coded integers of which one indicates a number of occurrences while the other indicates a prefix wherein said pair of coded integers precedes a number of suffixes of encoded pay load integers further carried by said signal or said storage medium, the number of said suffixes is proportional to said number of occurrences and at least a last of the encoded values can be decoded from at least a last of said suffixes by help of said indicated prefix.

In an embodiment of said storage medium, the other encoded pay load integers can be decoded from the other suffixes by help of a default prefix.

In a further embodiment of said storage medium, the encoded pay load integers are syntax elements associated with macro blocks comprised in a slice of a frame.

The invention also relates to a method for decoding a sequence of integers from a code sequence comprising a coded prefix, a coded number of occurrences and a number of coded suffixes said number of coded suffixes being proportional to said number of occurrences, said method comprises the steps of decoding said prefix, decoding said quantity, decoding the integers from the suffixes wherein the last of said integers is decoded from the last of said suffixes by help of said prefix and the other integers are decoded from the other suffixes by help of a remainder prefix.

In an embodiment of said decoding method, said remainder prefix equals said prefix.

In another embodiment of said decoding method, the remainder prefix is a default prefix.

In a further embodiment of said decoding method, the coded integers in the sequence indicate pay load data field sizes of a sequence of pay load data fields.

In yet a further embodiment of said decoding method, said pay load data fields carry encoded syntax elements of different types associated with macro blocks comprised in a slice of a frame.

In even yet a further embodiment of said decoding method, said encoded integers are encoded syntax elements of a single type and associated with macro blocks of a frame slice of a coded video frame sequence.

Further inventive aspects are apparent from the drawings, the description and the claims.

BRIEF DESCRIPTION OF THE DRAWINGS

Exemplary embodiments of the invention are illustrated in the drawings and are explained in more detail in the following description.

In the figures:

FIG. 1 depicts an example sequence of integers, suffixes of Exp-Golomb codes of said integers, the number of bits of each of said binary codes equalling a prefix length of the corresponding Exp-Golomb codes, run-length and run-level representations of said number of bits in Exp-Golomb code and final codes of the example sequence resulting from application of exemplary embodiments of the inventive method, FIG. 2 depicts the example sequence of FIG. 1, suffixes of hybrid Golomb codes of said integers, the prefix length of the corresponding hybrid Golomb codes, run-length and run-level representations of said prefix length and final codes of the example sequence resulting from application of exemplary embodiments of the inventive method.

DETAILED DESCRIPTION OF PREFERRED EMBODIMENTS

Figure 3:
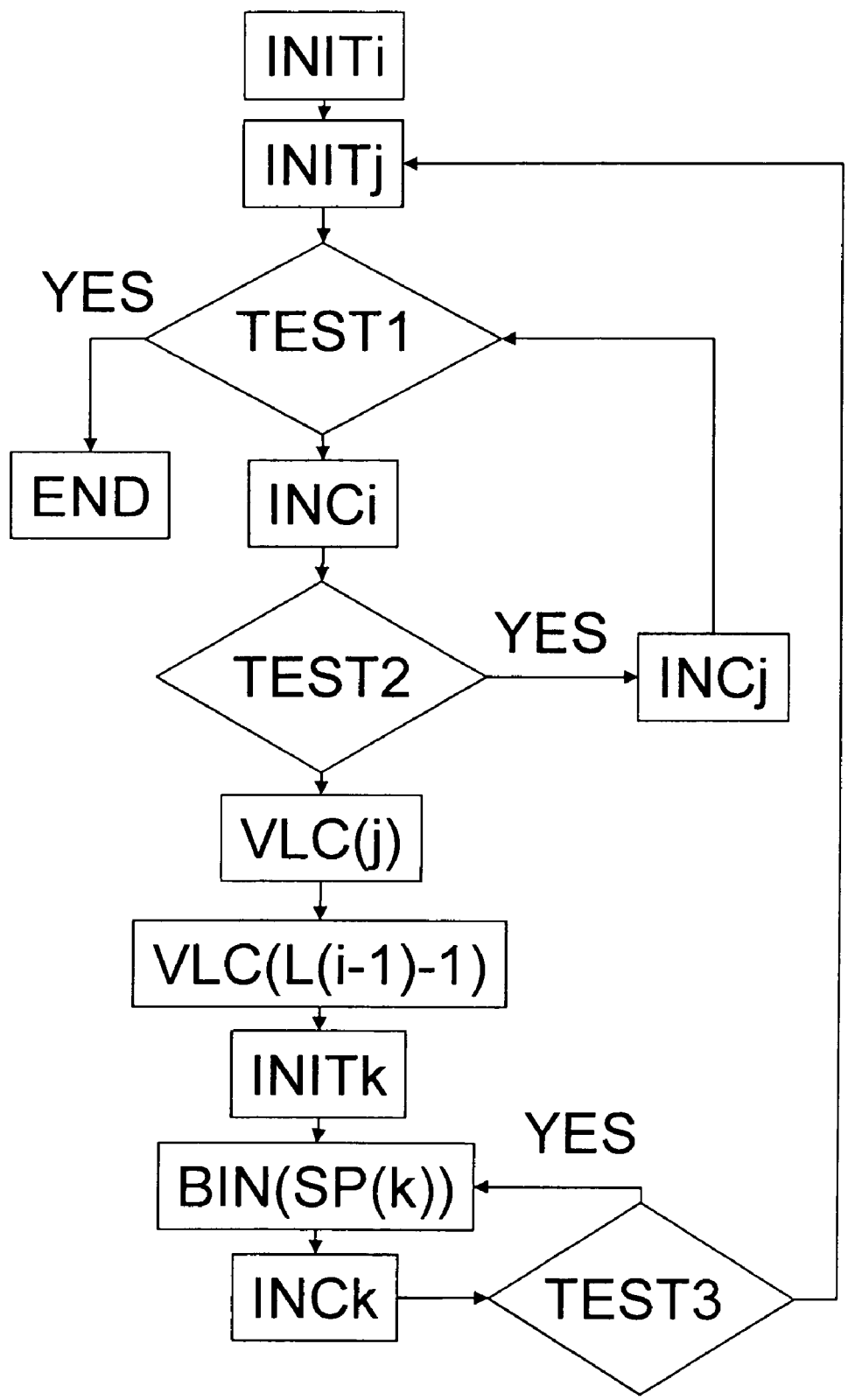
FIG. 3 depicts a flow diagram of an exemplary embodiment of the inventive method using run-length coding for prefixes and FIG. 4 depicts a flow diagram of an exemplary embodiment of the inventive method using run-level coding for prefixes.

Below, table 1 represents parameterizable VLC-codes according to Golomb as published in Golomb, S. W. "Run-length encodings", IEEE Trans. Inf. Theory, 1966. 7(12): 399-401. The parameter a indicates with which initial suffix length the code starts. That initial suffix length is prolonged by the number of Zeroes in a unary prefix. The first column of the table shows different parameters a, the second column represents different code words ranges in dependency on said parameter a and the last column shows the value range encoded with said code word ranges.

TABLE 1 exp-Golomb Codes

| Order | Exp-Golomb Code | CodeNum |
|---|---|---|
| a = 0 | 1 | 0 |
|  | 0 1 x0 | 1-2 |
|  | 0 0 1 x1 x0 | 3-6 |
|  | 0 0 0 1 x2 x1 x0 | 7-14 |
|  | ... | ... |
| a = 1 | 1 x0 | 0-1 |
|  | 0 1 x1 x0 | 2-5 |
|  | 0 0 1 x2 x1 x0 | 6-13 |
|  | 0 0 0 1 x3 x2 x1 x0 | 14-29 |
|  | ... | ... |
| a = 2 | 1 x1 x0 | 0-3 |
|  | 0 1 x2 x1 x0 | 4-11 |
|  | 0 0 1 x3 x2 x1 x0 | 12-27 |
|  | 0 0 0 1 x4 x3 x2 x1 x0 | 28-59 |
|  | ... | ... |

In FIG. 1 an example sequence of integers is depicted in the first row of a table. There are no two same integers in succession, thus, application of prior art run-length or run-level coding does not provide any benefit in coding efficiency.

The second row of the table in FIG. 1 contains the integers of the first row written in binary wherein the most significant bit (MSB) is omitted. The MSB is omissible as it will be deductible from a prefix further comprised in the final code.

Thus, there is no code in the second row for value 1 comprised in the first row. This is indicated by [ ] in the second row.

As it is apparent from the third row, though there are no two integers of the same value subsequent to each other, there are contiguous runs of integers requiring the same amount of bits for binary representation without MSB.

The fourth row of the table depicts a run-length code of the different bit amounts required for binary representation without MSB of the exemplary integers. Said run-length code is depicted in bracket notation. A bracket comprises a pair of decimal values wherein the former value represents a number of occurrences reduced by 1 as the number of occurrences is at least one. And the latter value represents a bit amount used for a binary representation without MSB. For instance, the first two brackets on the left, (0,2)(0,1), represent that 1 data field of 2 bits is followed by one data field of 1 bit.

The fifth row of the table depicts a run-level code of the different bit amounts required for binary representation without MSB of the exemplary integers. Again, a bracket notation is used. A bracket comprises a pair of decimal values wherein the former value represents an unreduced number of contiguous occurrences of a default bit amount, being 2 bits in this example, and the latter value represents a different bit amount terminating said contiguous occurrences of the default bit amount. The number of contiguous occurrences of the default bit amount may be 0, thus, it is not reduced. Within the example, the default value is 2. Thus, the first two brackets, (1,1) and (6,3), represent that 1 data field with 2 bits, the default bit amount, is followed by one data field with 1 bit and data field with 3 bits follows a sequences of 6 data fields, each encoded with 2 bits.

The two rows below the table in FIG. 1 represent an exemplary embodiment of the inventive run-length code of the example integer sequence based on Exp-Golomb coding. The code of the sequence starts with Exp-Golomb VLC representation of (0,2). This forms a prefix of a sequence of one pay load data field of length 2. The prefix is underlined in FIG. 1 for illustrative reasons. The one pay load data field carries a binary representation of the very first integer, i.e. the values 4 as binary represented by 100 wherein the MSB is omitted as it can be deducted from the prefix resulting in representation of value 4 by 00. Then, the next prefix follows, again underlined for illustration. This next prefix is prefix of a sequence of a single pay load data field of length 1 therefore it is formed from Exp-Golomb VLC representations of (0,1). It is followed by said single pay load data field of 1 bit carrying value 3 in binary representation wherein the MSB is omitted, again. Subsequently adjacent to the next prefix are binary representation of 6 integers represented by 2 bits and a single integer represented by 3 bits. And so on.

The two very last rows in FIG. 1 represent another exemplary embodiment of the inventive code of the example integer sequence based on Exp-Golomb coding. The code of the sequence starts on the left with sequence prefix 011 being the Exp-Golomb VLC representation of the default value which is 2 in this another example. Then, Exp-Golomb VLC representations of 1 and 1 representing (1,1) follow. This forms a prefix of a sequence of two pay load data fields, a first pay load data field of default length 2 and a second pay load data field of length 1. The prefix is underlined in FIG. 1 for illustrative reasons. The two pay load data fields carry binary representations of the first two integers, i.e. the values 4 and 3 are represented as 00 and 1. Then, the next prefix follows, again underlined for illustration. This next prefix is prefix of a sequence of 6 pay load data fields of default length 2 followed by a single pay load data field of length 3. Subsequently adjacent to the next prefix are binary representation of 6 integers represented by 2 bits and a single integer represented by 3 bits.

If the sequence ends with a contiguous sub-sequence of integers each being encoded with the default amount of bits, the last (run, level)-prefix may represent as level the default value. A level equalling the default value indicates the decoder termination of the integer sequence after the next run of integers encoded with the default amount of bits.

Below, table 2 represents so-called hybrid Golomb VLC-codes according to Golomb as published in Golomb, S. W. "Run-length encodings", IEEE Trans. Inf. Theory, 1966. 7(12): 399-401.

TABLE 2

Hybrid Golomb Code

| n | Hybrid Golomb Code |
|---|---|
| 0 | 1 |
| 1 | 01 |
| 2 | 0010 |
| 3 | 00110 |
| 4 | 00111 |
| 5 | 000100 |
| 6 | 000101 |
| 7 | 000110 |
| 8 | 0001110 |
| 9 | 0001111 |
| 10 | 00001000 |
| ... | ... |

Figure 2:
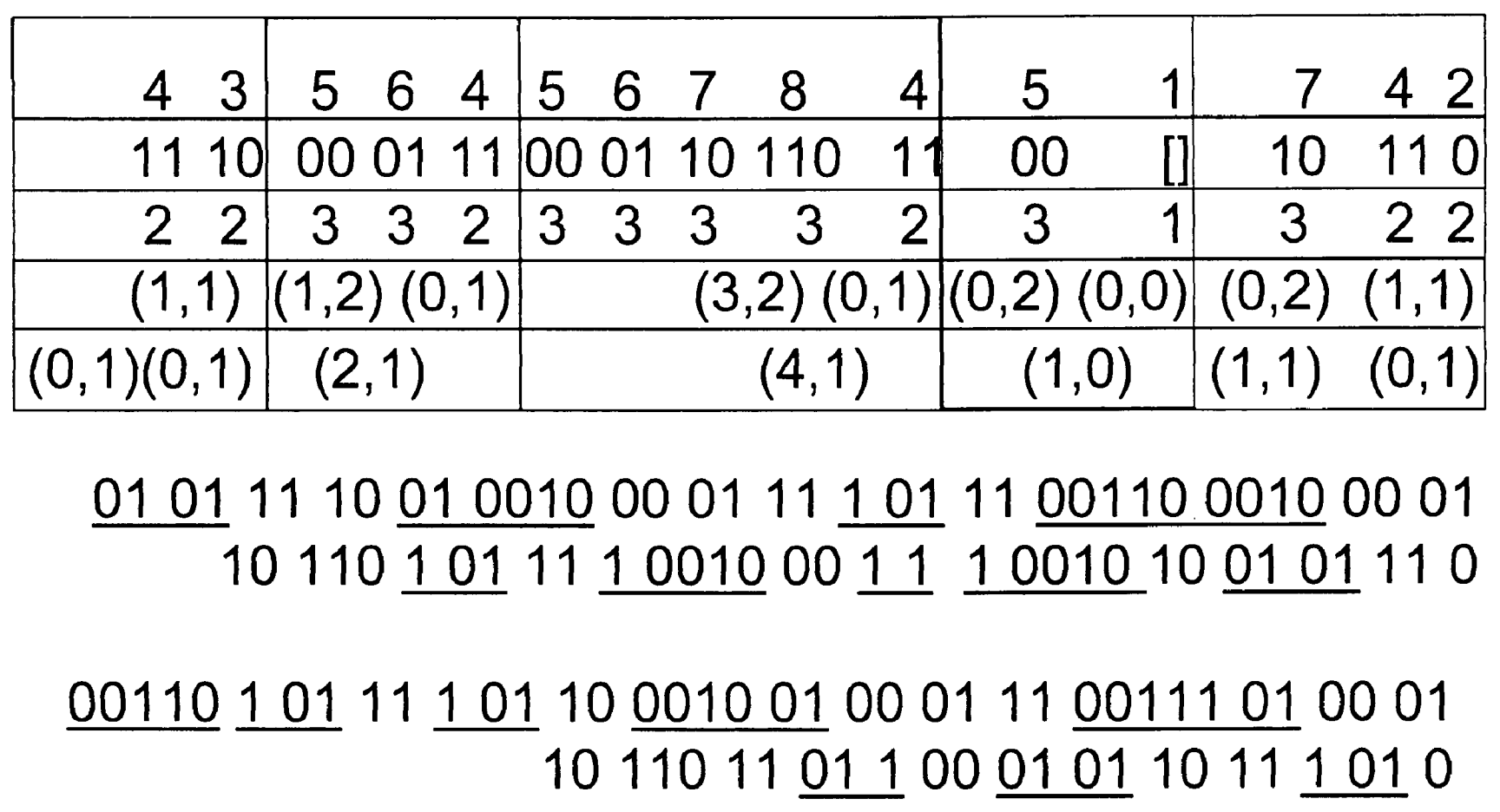

Encoding of the example integer sequence of FIG. 1 based on hybrid Golomb coding is explained by help of FIG. 2.

The second row of the table in FIG. 2 contains the suffixes of a hybrid Golomb code of the integers of the first row wherein the most significant bit (MSB) is omitted. The MSB is omissible as it will be deductible from a prefix further comprised in the final code. Thus, there is no code in the second row for value 1 comprised in the first row. This is indicated by [ ] in the second row.

As it is apparent from the third row of the table in FIG. 2, though there are no two integers of the same value subsequent to each other, there are contiguous runs of integers requiring the same prefix length, and thus the same prefix, in hybrid Golomb coding.

The fourth row of the table in FIG. 2 depicts a run-length code of the different prefixes required for hybrid-Golomb representation without MSB of the exemplary integers. Said run-length code is depicted in bracket notation. A bracket comprises a pair of decimal values wherein the former value represents a number of occurrences reduced by 1 as the number of occurrences is at least one. And the latter value represents a hybrid Golomb prefix length reduced by one as the prefix length is at least one. For instance, the first two brackets on the left, (1,1) and (1,2), represent that 2 suffixes of hybrid Golomb codes with a 2-bit-prefix are followed by two suffixes of hybrid Golomb codes with a 3-bit-prefix.

The fifth row of the table in FIG. 2 depicts a run-level code of the different prefixes required for hybrid-Golomb representation without MSB of the exemplary integers. Again, a bracket notation is used. A bracket comprises a pair of decimal values wherein the former value represents an unreduced number of contiguous occurrences of a default prefix, being a 3-bit-prefix in this another example, and the latter value represents a different prefix length terminating said contiguous occurrences of the default bit amount. As said different prefix length is at least 1, the latter value is by 1 smaller than said different prefix length. The number of contiguous occurrences of the default bit amount may be 0, thus, it is not reduced. Within the example, the default prefix length is 3. Thus, the first two brackets, (1,1) and (6,3), represent that 1 data field with 2 bits, the default bit amount, is followed by one data field with 1 bit and data field with 3 bits follows a sequences of 6 data fields, each encoded with 2 bits.

The two rows below the table in FIG. 2 represent an exemplary embodiment of the inventive run-length code of the example integer sequence. The code of the sequence starts with hybrid Golomb VLC representation of (1,1). This forms a prefix of a sequence of two suffixes of hybrid Golomb codes without MSB. The prefix is underlined in FIG. 1 for illustrative reasons. The two suffixes carry binary representation of the first and the second integer, i.e. the value 4 is represented in hybrid Golomb coding by the suffix 111 wherein the MSB is omitted as it can be deducted from the prefix resulting in representation of value 4 by 11. The subsequent value 3 is represented in hybrid Golomb coding by the suffix 110 wherein the MSB is omitted as it can be deducted from the prefix resulting in representation of value 3 by 10. Then, the next prefix follows, again underlined for illustration. This next prefix is prefix of a sequence of two suffixes with corresponding prefix length of 2 therefore it is formed from Exp-Golomb VLC representations of (1,2). It is followed by said single two suffixes 00 and 01 being the suffixes of hybrid Golomb representations of integers 5 and 6 wherein the MSB are omitted, again. And so on.

The two very last rows in FIG. 2 represent another exemplary embodiment of the inventive code of the example integer sequence based on hybrid Golomb coding. The code of the sequence starts on the left with sequence prefix 00110 being the hybrid Golomb VLC representation of the default value which is 3 in this another example. Then, hybrid Golomb VLC representations of 0 and 1 representing (0,1) follow. This forms a prefix of a sequence of one suffix representing the first integer value in the sequence, i.e. 11 representing 4 wherein the MSB is omitted. Again, (0,1) is hybrid Golomb VLC represented followed by 10 being the hybrid Golomb suffix for integer 3 wherein the MSB is omitted. Then, the next prefix follows, again underlined for illustration. This next prefix is prefix of a sequence of 2 suffixes with corresponding default prefix length of 3 followed by a single suffix corresponding prefix length 2. Subsequently adjacent to said next prefix, there are 2 hybrid Golomb suffixes representing the 2 integers having a 3-bit-prefix and a suffix representing one integer having a 2-bit-prefix. And so on.

From the exemplary embodiments explained in conjunction with FIGS. 1 and 2, it can be found that the run-length coding not only can be used for a series of symbols before VLC coding, but also can be used for the prefixes of a group of VLC code, irrespectively of the coding scheme the coding is based on. And by this invention, the redundancy among the prefixes of a group of consecutive VLC codes is removed.

In H.264/AVC, the pictures are usually encoded slice by slice. Each slice is independent and contains a large amount of macroblocks (MB). In detail, there are many syntax elements to be encoded for each macroblock. For example, Table 3 shows the main syntax elements to be coded in H.264/AVC baseline profile.

TABLE 3

H.264/AVC baseline syntax elements

| Syntax Element | Coding Method |
| --- | --- |
| mb_type | ue(v) |
| coded_block_pattern | me(v) |
| mb_qp_delta | se(v) |
| intra4x4_pred_mode | u(1) |
| (prev_intra4x4_pred_mode_flag, rem_intra4x4_pred_mode) | u(3) |
| intra_chroma_pred_mode | ue(v) |
| coeff_token | ce(v) |
| trailing_ones_sign_flag | u(1) |
| level_prefix | ce(v) |
| level_suffix | u(v) |
| total_zeros | ce(v) |
| run_before | ce(v) |
| mvd | se(v) |
| ref | te(v) |

When entropy_coding_mode equals 0, variable length coding is used according to Table 1 or Table 2. However, the main drawback of H.264/AVC VLC coding is that each syntax element is encoded separately, and it does not explore the redundancy between different VLC codes.

This exemplary embodiment of this invention comprises that, in the same slice, the prefixes of the same syntax elements of different macroblocks are coded together, for instance, using the run-length or run-level coding, as exemplarily describe in conjunction with FIG. 1.

This exemplary embodiment of the invention comprises the following steps.

Step 1: Encode the image/video using the H.264/AVC method.
Step 2: Reorganize the bitstreams within the same slice into the following format:
 mb_type (MB 1), mb_type (MB 2), . . . , mb_type (MB n)
 coded_block_pattern (MB 1), coded_block_pattern (MB 2), . . . , coded_block_pattern (MB n)
 run_before (MB 1), run_before (MB 2), . . . , run_before (MB n)
Step 3: Encode all the prefixes of the same syntax element of all the macroblocks within the same slice by a run-length coding method or a run-level coding method.
Step 2 may be performed prior to step 1.

An example of the coding method for mb_type using run-length is shown in Table 4:

TABLE 4 exemplary embodiment of the inventive run-length coding

| for( i = 0; i < total_mb_in_slice; i = i + run_mb_type_minus1 + 1 ) { | |
| --- | --- |
|     run_mb_type_minus1 | ue(v) |
|     length_mb_type_minus1 | ue(v) |
|     for( j = 0; j<run_mb_type_minus1+1; j++) { | |
|         suffix_mb_type | |
|     } | |
| } | |

A flow diagram of said example of the coding method for mb_type using run-level is depicted in FIG. 3.

In an initializing Step INITi counting parameter i is initialized as 0. Furthermore, an empty bit string is initialized. Then, in step INITj a further counting parameter j is initialized as 0. Subsequently, in decision step TEST1 it is decided whether i meets or exceeds the total number of macro-blocks in the slice. If so, the method proceeds to step END. Otherwise, the method continues with step INCi increasing the counter parameter i by 1. Then, decision step TEST2 is performed determining whether the binary representation of a certain syntax parameter related to macro-block (i) comprises the same amount of bits as the binary representation of a certain syntax parameter related to macro-block (i-1). If so, counter parameter j is incremented by 1 in step INCj before the method returns to decision step TEST1. Otherwise, the method continues with variable length coding of the current value of counter parameter j in step VLC(j) and with appending of said code to said bit string. Then, a variable length code representation of the number of bits required for binary representing the value of said certain syntax parameter for macro-block (i-1) diminished by 1 is appended in step VLC (L(i-1)-1). In subsequent step INITk, yet a further counter parameter k is initialized as i-j-1. Then, a binary representation of the value of said certain syntax parameter for macro-block (k) is appended to said bit string in step BIN(SP(k)). This step is followed by a k incrementing step INCk. After incrementing k by 1, it is checked in decision step TEST3 whether k is still smaller than i. If so, the method returns to step BIN(SP(k)). If not, the method returns to step INITj.

An example of the coding method for mb_type using run-level is shown in Table 5:

TABLE 5 exemplary embodiment of the inventive run-level coding

| for( i = 0; i < total_mb_in_slice; i = i + run_mb_type_default) { | |
| --- | --- |
|     run_mb_type_default_length | ue(v) |
|     length_mb_type_other_length | ue(v) |
|     for( j = 0; j<run_mb_type_default; j++) { | |
|         suffix_mb_type_default length | |
|     } | |
|     suffix_mb_type_other_length | |
| } | |

Figure 4:
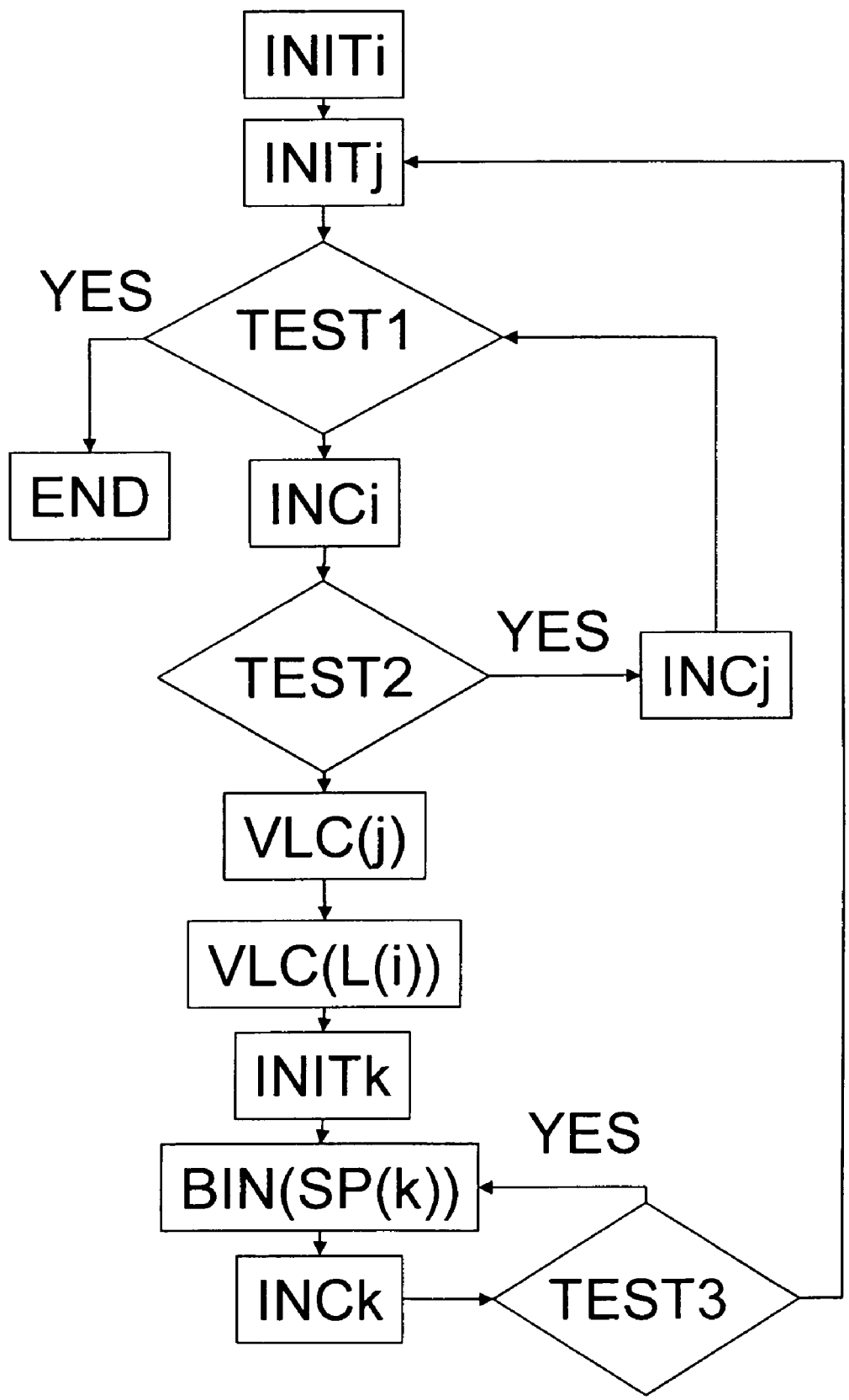

A flow diagram of said example of the coding method for mb_type using run-level is depicted in FIG. 4.

In an initializing Step INITi counting parameter i is initialized as 0. Furthermore, an empty bit string is initialized. Then, in step INITj a further counting parameter j is initialized as 0. Subsequently, in decision step TEST1 it is decided whether i meets or exceeds the total number of macro-blocks in the slice. If so, the method proceeds to step END. Otherwise, the method continues with step INCi increasing the counter parameter i by 1. Then, decision step TEST2 is performed determining whether amount of bits used for binary representation of a certain syntax parameter related to macro-block (i) equals a default bit amount. If so, counter parameter j is incremented by 1 in step INCj before the method returns to decision step TEST1. Otherwise, the method continues with variable length coding of counter parameter j in step VLC(j) and with appending of said code to said bit string. Then, a variable length code representation of the number of bits required for binary representing the value of said certain syntax parameter for macro-block (i) is appended in step VLC(L(i)). In subsequent step INITk, another counter parameter k is initialized to i-j-1. Then, a binary representation of the value of said certain syntax parameter for macro-block (k) is appended in step BIN(SP(k)). This step is followed by a k incrementing step INCk. After incrementing k by 1, it is checked in decision step TEST3 whether k is still smaller than i. If so, the method returns to step BIN(SP(k)). If not, the method returns to step INITj.

Some kinds or all kinds of the other syntax elements can also be encoded in the similar way.

From statistic experiment, this kind of encoding scheme can further improve the performance of existing entropy coding methods, since the same syntax elements of many consecutive macroblocks frequently have the same length of prefix, and run-length coding can greatly reduce this kind of statistical redundancy.

The original VLC codes of syntax element intra4×4_pred_mode of consecutive blocks after H.264/AVC coding requires the length of VLC codes for this syntax element to be 1 or 4. Thus, a run-level coding of said lengths appears beneficial.

2D-VLC table may be used to further encode (run, level) pairs. The detail coding method can be the same as the (run, level) coding method for DCT coefficients in MPEG-2.

In the decoder, the prefixes of the syntax element are first decoded. If the length of prefix is 1, then there is no suffix. Otherwise, supposing the length of prefix is x (1<x<=4), then the length of its suffix is 4-x. The length of VLC codes for this syntax element must be 1 or 4. If "0000" is appeared in VLC code, then the prefix can be regarded as 5, and the decoder can recognize it without suffix.

To be more general, the further encoding method for the prefixes of a series of VLC codes can be any other method, e.g., CAVLC in H.264/AVC, to reduce the redundancy within the group of VLC codes.

The invention introduces some latency as well as memory and processing requirements which appear to be countervailed by the improvements achieved with respect to the lossless compression ratio.

Exemplarily the invention is related to encoding of a group of signals into a series of VLC codes, and further encoding the prefixes of a group of VLC codes to remove the statistical redundancy among the prefixes of these VLC codes. In an exemplary embodiment, the inventive method encodes the prefixes of a number of VLC codes using a run-length coding wherein run refers to the number of occurrences of VLC codes which have the same length of prefix. Length refers to the number of bits from which the prefix consists. The prefix consists of several consecutive Zero-valued bits followed by a One-bit which may be the most significant bit of the suffix. Or, the prefix is formed by several consecutive "1" plus a "0".

Instead of run-length coding, (run-1)-(length-1) coding can be performed as the run is at least 1 and the length is at least 1, as well. Encoding the (run-1, length-1) pair may be achieved by looking up a 2D VLC look-up table.

The prefixes of a number of VLC codes may be encoded using a kind of (run, level) coding. Here, run counts the number of consecutive VLC codes whose prefix length takes a default value, for instance 1. And level represents the length of a prefix of a subsequent VLC code whose prefix length differs from said default value. The (run, level) pair may be encoded by looking up a 2D-VLC table like the DCT coefficients coding in MPEG-2. The (run, level) coding can also make use of other methods such as CAVLC in H.264/AVC.

Codewords of the same kind of syntax element of different macroblock within the same slice/picture/frame in image/video coding may be encoded by any of the inventive methods.

In one embodiment, a group of signals is encoded into a series of VLC codes, and further encodes the prefixes of a couple of VLC codes by run-length coding to generate new VLC codes, and then further encodes the prefixes of these new VLC codes by run-length coding. That is, this embodiment uses run-length coding to encode the prefixes of multiple code words iteratively.

What is claimed is:

1. A method for encoding a sequence of integers, said method comprises the steps of:
   identifying a contiguous sub-sequence in the sequence of integers wherein said sub-sequence comprises interrelated integers having a same prefix in a variable length code and an independent last integer; and
   forming a code for the contiguous sub-sequence by help of code for an indication of the number of interrelated integers in said contiguous subsequence, a code for a prefix indication and the suffixes of variable length codes of the integers in the contiguous sub-sequence.

2. The method according to claim 1, wherein said prefix indication indicates said same prefix which is the prefix of a variable length code of the independent last integer.

3. The method of claim 1, wherein said same prefix is a default prefix and said prefix indication indicates another prefix which is the prefix of a variable length code of the independent last integer.

4. The method of claim 3, further comprising:
   enclosing a binary representation of said default prefix in said modified binary sequence.

5. The method according to claim 1, said sequence of integers being related to a sequence of coded pay load values, said integers indicating the length of data fields carrying said coded pay load values.

6. The method for encoding integer valued syntax elements of different types associated with macro blocks comprised in a slice of a frame, said method comprising:
   sorting the syntax elements according their type;
   forming a sequence out of syntax elements of a single type; and
   encoding the sequence of syntax elements of a single type according to claim 1.

7. The method for encoding integer valued syntax elements of different types associated with macro blocks comprised in a slice of a frame, said method comprises
   sorting the syntax elements according their type;
   forming a sequence out of syntax elements of a single type; and
   encoding the sequence of syntax elements of a single type as said sequence of encoded pay load values according to claim 5.

8. A storage medium carrying a pair of coded integers of which one indicates a number of occurrences while the other indicates a prefix wherein said pair of coded integers precedes a number of suffixes of encoded pay load integers further carried by said storage medium, the number of said suffixes is proportional to said number of occurrences and at least a last of the encoded values can be decoded from at least a last of said suffixes by help of said indicated prefix.

9. The storage medium according to claim 8, wherein the other encoded pay load integers can be decoded from the other suffixes by help of a default prefix.

10. A method for decoding a sequence of integers from a code sequence comprising a coded prefix, a coded number of occurrences and a number of coded suffixes said number of coded suffixes being proportional to said number of occurrences, said method comprises the steps of:
   decoding said prefix;
   decoding said quantity;
   decoding the integers from the suffixes wherein: the last of said integers is decoded from the last of said suffixes by help of said prefix, and the other integers are decoded from the other suffixes by help of a remainder prefix.

11. The method according to claim 10, wherein said remainder prefix equals said prefix.

12. The method according to claim 11, wherein the remainder prefix is a default prefix.

13. The method according to claim 10, wherein the coded integers in the sequence indicate pay load data field sizes of a sequence of pay load data fields.

14. The method according to claim 13, wherein said pay load data fields carry encoded syntax elements of different types associated with macro blocks comprised in a slice of a frame.

15. The method according to claim 10, wherein said encoded integers are encoded syntax elements of a single type and associated with macro blocks of a frame slice of a coded video frame sequence.

* * * * *